United States Patent
Chang et al.

(10) Patent No.: US 11,916,085 B2
(45) Date of Patent: Feb. 27, 2024

(54) ARRAY SUBSTRATE, METHOD OF MANUFACTURING ARRAY SUBSTRATE, AND DISPLAY PANEL

(71) Applicant: HKC CORPORATION LIMITED, Shenzhen (CN)

(72) Inventors: Hongyan Chang, Shenzhen (CN); Zhenya Li, Shenzhen (CN); Guangjia Wang, Shenzhen (CN); Bing Han, Shenzhen (CN); Shishuai Huang, Shenzhen (CN); Xiaojie Wang, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/993,980

(22) Filed: Nov. 24, 2022

(65) Prior Publication Data
US 2023/0197734 A1 Jun. 22, 2023

(30) Foreign Application Priority Data
Dec. 17, 2021 (CN) .......................... 202111554046.4

(51) Int. Cl.
*H01L 27/14* (2006.01)
*H01L 27/12* (2006.01)
*G02F 1/1362* (2006.01)

(52) U.S. Cl.
CPC ...... *H01L 27/124* (2013.01); *G02F 1/136222* (2021.01); *H01L 27/1262* (2013.01)

(58) Field of Classification Search
CPC ............... H01L 27/124; H01L 27/1262; G02F 1/136222; G02F 1/136286;
(Continued)

(56) References Cited

U.S. PATENT DOCUMENTS 9,806,102 B2 * 10/2017 Zhang ............... G02F 1/134336
2002/0075422 A1    6/2002 Kimura et al.
2021/0349365 A1 * 11/2021 Fu ..................... G02F 1/136295

FOREIGN PATENT DOCUMENTS

| CN | 104956475 A | 9/2015 |
| CN | 105304649 A | 2/2016 |

(Continued)

OTHER PUBLICATIONS

Chinese First office action, Application No. 202111554046.4, dated Aug. 30, 2022(11 pages).

*Primary Examiner* — Tan N Tran

(57) ABSTRACT

A base substrate and a first metal layer laminated on the base substrate are included. A first laminated portion and a second laminated portion are arranged on and directly contact a side of the first metal layer. The first laminated portion includes a first insulating layer, a second metal layer, a second insulating layer and a first conductive layer. The first laminated portion is arranged with a first via. The second laminated portion includes a third insulating layer and a second conductive layer laminated on the third insulating layer. The second laminated portion is arranged with a second via. The first via is connected to the first conductive layer, the second via is connected to the second conductive layer, and the first conductive layer is connected to the second conductive layer. The second laminated portion is extended to reach an edge of the first metal layer.

12 Claims, 6 Drawing Sheets

(58) Field of Classification Search
CPC ............. G02F 1/133345; G02F 1/1333; G02F
1/136227; G02F 1/13629
USPC .................................................... 257/59, 72
See application file for complete search history.

(56) References Cited

FOREIGN PATENT DOCUMENTS

| | | | |
|---|---|---|---|
| CN | 105321930 | A | 2/2016 |
| CN | 106575063 | A | 4/2017 |
| CN | 107180838 | A | 9/2017 |
| CN | 209784704 | U | 12/2019 |
| CN | 110850649 | A | 2/2020 |
| CN | 111129029 | A | 5/2020 |
| JP | H10177180 | A | 6/1998 |
| JP | 2000029066 | A | 1/2000 |
| JP | 2005084324 | A | 3/2005 |

\* cited by examiner

ARRAY SUBSTRATE, METHOD OF MANUFACTURING ARRAY SUBSTRATE, AND DISPLAY PANEL

CROSS REFERENCE TO RELATED APPLICATIONS

The present disclosure claims priority of Chinese Patent Application No. 202111554046.4, filed on Dec. 17, 2021 in China National Intellectual Property Administration, the entire contents of which are hereby incorporated by reference in their entireties.

TECHNICAL FIELD

The present disclosure relates to the field of displaying, and in particular to an array substrate, a method of manufacturing the array substrate, and a display panel.

BACKGROUND

An array substrate is an important component of a LCD panel. In a process of manufacturing the array substrate, different metal layers need to be connected through cross-layer through holes.

In the art, a second metal layer may be laminated on a first metal layer, and the cross-layer through holes are defined in the second metal layer to expose the first metal layer. n this way, a conductive layer may be deposited on the second metal layer and the exposed first metal layer to obtain the through holes connecting the first metal layer and the second metal layer.

While manufacturing the array substrate, the second metal layer may be etched twice in a 4 mask process (a lithographic process performed 4 times). While performing etching using an etching solution, bubbles may be generated and remain in the through holes, affecting the subsequent deposition of the conductive layer, further affecting conductivity of the first metal layer and the second metal layer.

SUMMARY OF THE DISCLOSURE

According to a first aspect of the present disclosure, an array substrate is provided and includes: a base substrate and a first metal layer laminated on and directly contacting the base substrate, wherein a first laminated portion and a second laminated portion are arranged on and directly contact a side of the first metal layer away from the base substrate. The first laminated portion includes a first insulating layer, a second metal layer, a second insulating layer and a first conductive layer, wherein the first insulating layer, the second metal layer, the second insulating layer and the first conductive layer are successively laminated. The first laminated portion is arranged with a first via. The second laminated portion comprises a third insulating layer and a second conductive layer laminated on and directly contacting the third insulating layer. The second laminated portion is arranged with a second via. The first via is connected to the first conductive layer, the second via is connected to the second conductive layer, and the first conductive layer is connected to the second conductive layer to allow the first metal layer to be conductive with the second metal layer. The second laminated portion is extended to reach an edge of the first metal layer.

According to a second aspect of the present disclosure, a display panel is provided and includes the array substrate according to any one of the above embodiments, a color film substrate, and liquid crystal molecules. The array substrate and the color film substrate are disposed opposite to each other, the liquid crystal molecules are disposed between the array substrate and the color film substrate.

According to a third aspect of the present disclosure, a method of manufacturing an array substrate is provided and includes: providing a base substrate, depositing a first metal layer on the base substrate; successively depositing a first insulating layer and a second metal layer in a first deposition region of the first metal layer, exposing a second deposition region of the first metal layer, wherein the second deposition region extends to reach an edge of the first metal layer; depositing a second insulating layer in the first deposition region where the first insulating layer and the second metal layer are deposited, depositing a third insulating layer on the second deposition region, performing dry etching on the second insulating layer and the third insulating layer, obtaining a first through hole exposing the second metal layer and a second through hole exposing the first metal layer; depositing the conductive layer on the entire insulating layer after the dry etching, forming the first laminated portion in the first deposition region and the second laminated portion in the second deposition region, forming the first via from the first through hole, forming the second via from the second through hole, obtaining the array substrate; wherein the second laminated portion extends to reach the edge of the first metal layer.

Figure 1:
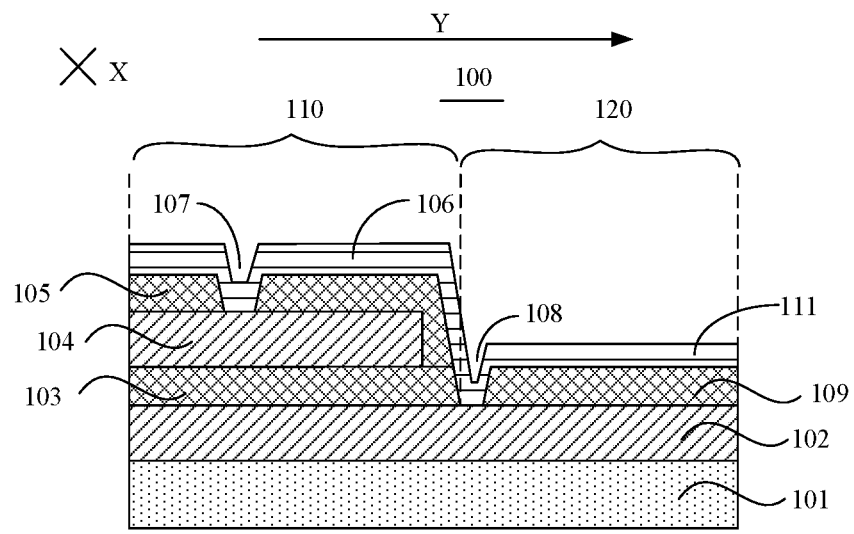
FIG. 1 is a structural schematic view of a cross section of an array substrate according to an embodiment of the present disclosure.

Reference numerals:
100, array substrate; 101, base substrate; 102, first metal layer; 110, first laminated portion; 120 second laminated portion; 103, first insulating layer, 104, second metal layer; 105, second insulating layer; 106, first conductive layer; 109, third insulating layer; 111, second conductive layer; 107, first via; 108, second via; 307, first through hole; 308, second through hole; 210, first deposition region; 220, second deposition region; X, first direction; Y, second direction; 200, display panel; 201, color film substrate; 202, array substrate; 203, liquid crystal molecules.

DETAILED DESCRIPTION

Technical solutions of the embodiments of the present disclosure will be clearly and completely described below by referring to the accompanying drawings in the embodiments of the present disclosure. Obviously, the described embodiments show only some of, but not all of, the embodiments of the present disclosure. All other embodiments obtained by any ordinary skilled person in the art based on the embodiments in the present disclosure without making creative work shall fall within the scope of the present disclosure.

To be noted that, all directional indications (such as up, down, left, right, forward, backward . . . ) in the present disclosure are used to explain relative positions between components at a particular pose (the pose shown in the accompanying drawings), movements, and so on. When the particular pose changes, the directional indications may change accordingly.

In addition, terms "first" and "second" in the present disclosure are used for descriptive purposes only, and shall not be interpreted as indicating or implying relative importance or implicitly specifying the number of the described technical features. Therefore, features defined by the "first" and the "second" may explicitly or implicitly include at least one such feature. Technical solutions of various embodiments can be combined with each other, but the combination must be achieved by any ordinary skilled person in the art. When technical solutions of the various embodiments contradict each other or combination of the technical solutions cannot be achieved, the combination of the technical solutions shall be interpreted as not existing, and is not within the scope of the present disclosure.

As shown in FIG. 1, FIG. 1 is a structural schematic view of a cross section of an array substrate according to an embodiment of the present disclosure.

The array substrate 100 of the present embodiment includes a base substrate 101 and a first metal layer 102. The base substrate 101 and the first metal layer 102 directly contact each other and are laminated with each other. A side of the first metal layer 102 away from the base substrate 101 is arranged with a first laminated portion 110 and a second laminated portion 120. The first laminated portion 110 and the second laminated portion 120 directly contact the first metal layer 102.

The first laminated portion 110 includes a first insulating layer 103, a second metal layer 104, a second insulating layer 105 and a first conductive layer 106. The first insulating layer 103, the second metal layer 104, the second insulating layer 105 and the first conductive layer 106 are laminated and attach to each other. The first laminated portion 110 defines a first via 107. The second laminated portion 120 includes a third insulating layer 109 and a second conductive layer 111. The third insulating layer 109 and the second conductive layer 111 laminated and attach to each other. The second laminated portion 120 defines a second via 108.

In the present embodiment, the first via 107 and the second via 108 are both metallized. For example, metal may be received in the vias. Metal in the first via 107 is connected to the first conductive layer 106. Metal in the second via 108 is connected to the second conductive layer 111. The first conductive layer 106 is connected to the second conductive layer 111 to allow the first metal layer 102 to be conductive to the second metal layer 104, achieving electrical connection between the first metal layer 102 and the second metal layer 104.

The second laminated portion 120 extends to an edge of the first metal layer 102. In detail, the first conductive layer 106 disposed on a side of the second via 108 near the first via 107 is arranged to cover the second insulating layer 105 of the first laminated portion 110. The second conductive layer 111 disposed on a side of the second via 108 away from the first via 107 is arranged to cover the third insulating layer 109 of the second laminated portion 120 and extends to reach the edge of the first metal layer 102.

In the present embodiment, the first laminated portion 110 includes the first insulating layer 103, the second metal layer 104, the second insulating layer 105, and the first conductive layer 106, and the first insulating layer 103, the second metal layer 104, the second insulating layer 105, and the first conductive layer 106 are laminated and attached to each other. The second laminated portion 120 includes the third insulating layer 109 and the second conductive layer 111 laminated on and attached to the third insulating layer 109. The second insulating layer 105 of the first laminated portion 110 and the third insulating layer 109 of the second laminated portion 120 are prepared simultaneously by a same process and have a substantially same thickness. The first conductive layer 106 of the first laminated portion 110 and the second conductive layer 111 of the second laminated portion 120 are prepared simultaneously by a same process and have a substantially same thickness.

That is, a height difference may be present between the first laminated portion 110 and the second laminated portion 120 and may be formed since the first insulating layer 103 and the second metal layer 104 are arranged. While etching the array substrate 100, an etching solution at the second via 108 may flow along the second lamination 120 to flow out of the edge of the first metal layer 102 due to the height difference between two sides of the second via 108. In this way, the amount of the etching solution remaining in the second via 108 may be reduced, less bubbles may be generated, and contact between the second conductive layer 111 and the first metal layer 102 may not be affected.

In the present embodiment, the second via 108 may be defined to allow any two metal layers disposed at different layers to be connected with each other. For example, the via may be applied for cross-layer connection between metal layers at various position, such as for an electrostatic ring, a bonding lead cross-layer connection, peripheral wires for substrates, or cross-layer connection of wires-on-array in a substrate. The present disclosure does not limit the application of the via.

According to the present disclosure, the array substrate is provided. The second laminated portion may be arranged and includes the third insulating layer and the second conductive layer laminated on and directly contacting the third insulating layer. The first laminated portion may be arranged and includes the first insulating layer, the second metal layer, the second insulating layer, and the first conductive layer. The height difference is generated between two sides of the second via. While etching the array substrate, the etching solution at the second via may flow along a side of the via which has a lower height and flow out of the edge of the first metal layer due to the height difference. The amount of the etching solution remaining in the second via may be reduced, and less bubbles may be generated. Contact between the first metal layer and the second metal layer may not be affected, and an effective contact area between the conductive layer at the second via and the first metal layer may be increased, such that electrical connection between metal layers of the array substrate may be improved, and reliability and stability of the array substrate may be improved.

In some embodiments, the first via 107 extends through the second insulating layer 105 of the first laminated portion 110 to reach the second metal layer 104. That is, the first via 107 extends through the second insulating layer 105 covering the second metal layer 104 to reach the second metal layer 104. In more detail, a through hole is defined in the insulating layer 105 and extending through the insulating layer 105 to expose a portion of the second metal layer 104. Further, metal is received in the through hole, forming the first via 107, and the metal is connected to the second metal layer 104. The second via 108 extends through the third insulating layer 109 to reach the first metal layer 102. That is, the second via 108 extends through the third insulating layer 109 covering the first metal layer 102 to reach the first metal layer 102. Similarly, a through hole is defined in the third insulating layer 109 and extending through the third insulating layer 109 to expose a portion of the first metal layer 102. Further, metal is received in the through hole, forming the second via 108, and the metal is connected to the first metal layer 102.

Since the height difference is generated between the first laminated portion 110 and the second laminated portion 120, the height difference is generated between the second insulating layer 105 of the first laminated portion 110 and the third insulating layer 109 of the second laminated portion 120. In this way, while the etching the array substrate 100 after the insulating layers are arranged, the etching solution may be guided to flow out of the array substrate by taking the height difference, ensuring a contact area between the third insulating layer 109 and other structures that will contact the third insulating layer 109 in subsequent processes. A bonding force between the third insulating layer 109 and other structures may be improved, ensuring the reliability of the array substrate 100 to some extent.

The first via 107 and the second via 108 are connected through the first conductive layer 106 and the second conductive layer 111. In particular, the metal of the first via 107 and the metal of the second via 108 are connected. In this way, the first metal layer 102 may be conductive to the second metal layer 104 to achieve a cross-layer connection between the first metal layer 102 and the second metal layer 104. In the present embodiment, the first via 107 and the second via 108 are connected to corresponding respective metal layers by extending through the insulating layers covering the respective metal layers. Functions of each metal layer may be achieved, and the first metal layer 102 may be electrically connected to the second metal layer 104. An impact on electrical functions of the first metal layer 102 and the second metal layer 104 may be reduced.

In some embodiments, the first via 107 and the second via 108 may be defined at other locations to connect to the second metal layer 104 and the first metal layer 102 respectively, allowing the first metal layer 102 to be cross-layer connected to the second metal layer 104.

In some embodiments, each of a projection of the second metal layer 104 on a plane in which the first metal layer 102 is disposed and a projection of the first insulating layer 103 on the plane in which the first metal layer 102 is disposed may overlap with a portion of the first metal layer 102. That is, the second metal layer 104 and the first insulating layer 103 may be laminated on a portion of the first metal layer 102 contacting the first laminated portion 110 and may not be laminated on another portion of the first metal layer 102 contacting the second laminated portion 120. In this way, the height difference is generated between two sides of the second via 108, such that the conductive layer disposed on a side of the second via 108 away from the first via 107 may be arranged to cover the second insulating layer 105 disposed on a side of the first metal layer 102 and may extend to reach the edge of the first metal layer 102. In this way, all of the etching solution may flow out of the array substrate. The etching solution may not remain in the second via 108 or remain at any location of the array substrate 100. In this way, a contact area between the second conductive layer 111 and each metal layer and a contact area between the second conductive layer 111 and each insulating layer may be increased, improving stability and reliability of the array substrate 100.

In some embodiments, the second metal layer 104 may be laminated to cover the entire first metal layer 102 and spaced apart from the first metal layer 102, allowing the height difference between two sides of the second via 108 to be generated.

In some embodiments, a plurality of first metal layers 102 may be spaced apart from each other and arranged on a same plane on the array substrate 100. The number and positions of the plurality of first metal layers 102 may be determined based on the actual demands and will not be limited by the present disclosure.

Each of the plurality of first metal layers 102 may be arranged with the first laminated portion 110 and the second laminated portion 120, respectively. The first laminated portion 110 defines a plurality of first vias 107, and the second laminated portion 120 defines a plurality of second vias 108. Each of the plurality of first vias 107 is connected to a corresponding one of the plurality of second vias 108. Stability of electrical connection between the first metal layer 102 and the second metal layer 104 in the array substrate 100 may be improved by connections between the plurality of first vias 107 and the plurality of second vias 108.

In an embodiment, each of the plurality of first metal layers 102 may be arranged with a plurality of second metal layers 104 arranged on a same plane. The plurality of second metal layers 104 are electrically connected to the laminated first metal layer 102 through corresponding first vias 107 and corresponding second vias 108. In this way, electrical connection with the second metal layers 104 and the corresponding first metal layer 102 of the array substrate 100 may be achieved, improving the conductivity of the array substrate 100.

In an embodiment, the array substrate 100 may be arranged with one second metal layer 104, and the second metal layer 104 may be connected to a corresponding laminated first metal layer 102 by connecting to a plurality of first vias 107 and a plurality of second vias 108 at the same time. In this way, stability of electrical connection between the second metal layer 104 and the first metal layer 102 may be improved.

The plurality of first vias 107 and the plurality of second vias 108 are defined above the first metal layer 102. In some embodiments, some of the plurality of first vias 107 may be connected to some of the plurality of second vias 108, respectively, to allow the first metal layer 102 to be conductive with the second metal layer 104. In some embodiments, all of the plurality of first vias 107 may be connected to all of the plurality of second vias 108, respectively, to allow the first metal layer 102 to be conductive with the second metal layer 104. The connections between the plurality of first vias 107 and the plurality of second vias 108 may be determined based on actual demands and will not be limited herein.

On each first metal layer 102, the plurality of first vias 107 are arranged along a first direction X and are spaced apart from each other, the plurality of second vias 108 are arranged along the first direction X and are spaced apart from each other, and the plurality of first vias 107 and the plurality of second vias 108 are alternately arranged along the first direction X. That is, the plurality of first vias 107 and the plurality of second vias 108 are periodically arranged in sequence. For example, when a total of eight vias are defined in the first direction X, an arrangement order is: a first via 107, a second via 108, a first via 107, a second via 108, a first via 107, a second via 108, a first via 107, and a second via hole 108. In this way, the first via 107 and the second via 108 correspondingly connected the instant first via 107 are disposed adjacent to each other, and therefore, and a length of the conductive layer 106 between the first via 107 and the correspondingly-connected second via 108 may be reduced. A resistance of the conductive layer between the first metal layer 102 and the second metal layer 104 may be reduced. A high temperature at a certain region may be prevented, and the substrate may not be burned.

The plurality of first vias 107 and the plurality of second vias 108 on each first metal layer 102 may be arranged alternately and arranged as an array, such as arranged into 1 row of 6 columns, 4 rows of 8 columns, and so on. The arrangement may be determined based on actual requirements.

In some embodiments, the plurality of first vias 107 on the first metal layer 102 may be arranged in at least two rows, and the plurality of second vias 108 on the first metal layer 102 may be arranged in at least two rows. The plurality of first vias 107 and the plurality of second vias 108 may be arranged alternately in a second direction Y. The second direction Y is perpendicular to the first direction X. In this way, corresponding connection between the plurality of first vias 107 and the plurality of second vias 108 may be achieved, temperatures generated during the electrical connection may be less concentrated, and the array substrate may not be burned easily.

Figure 2:
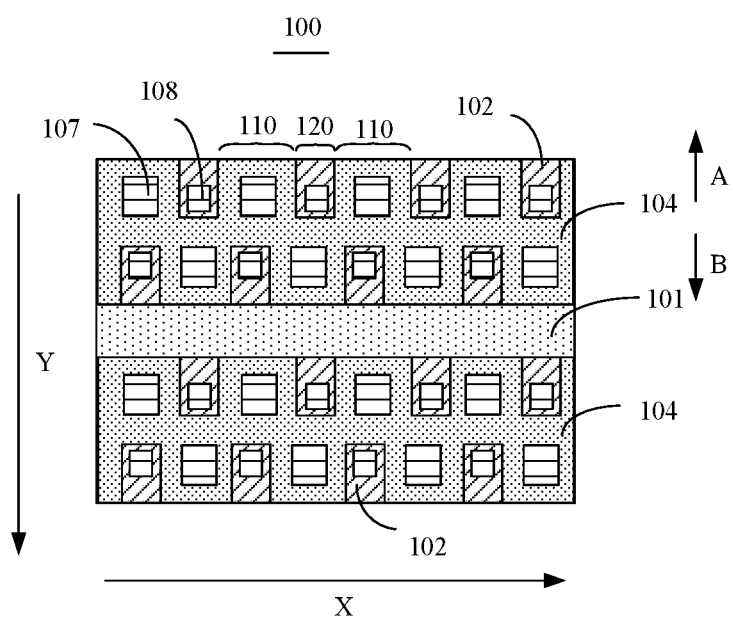
FIG. 2 is a top view of an array substrate according to a first embodiment of the present disclosure.

As shown in FIG. 2, FIG. 2 is a top view of an array substrate according to a first embodiment of the present disclosure. In order to provide a concise illustration, the first conductive layer 106, the second conductive layer 111, the third insulating layer 109 and the second insulating layer 105 are omitted from FIG. 2, and the second metal layer 104 and the first metal layer 102 are exposed and shown in FIG. 2. The above structure does not define a structure of an actual array substrate 100 in practice. Subsequent embodiments may be similar to the present embodiment and will not be described repeatedly.

The array substrate 100 of the present embodiment includes a plurality of first metal layers 102 spaced apart from each other, and the plurality of first metal layers 102, which are spaced apart from each other, are arranged on and directly contact the base substrate 101.

The plurality of first vias 107 on each of the plurality of first metal layers 102 are arranged in two rows, and the plurality of second vias 108 on each of the plurality of first metal layers 102 are arranged in two rows. In this way, each of the plurality of second vias 108 may be located near the edge of the first metal layer 102. The plurality of first vias 107 and the plurality of second vias 108 are alternately arranged in the second direction Y and alternately arranged in the first direction X.

On the first metal layer 102, a second laminated portion 120, which is arranged with one of the two rows of second vias 108, extends in a third direction A to reach the edge of the first metal layer 102. A second laminated portion 120, which is arranged with the other one of the two rows of second vias 108, extends in a fourth direction B to reach the edge of the first metal layer 102.

The third direction A may be opposite to the fourth direction B. The third direction A and the fourth direction B shown in the figure of the present disclosure are for illustrative purposes only. In some embodiments, the third direction A and the fourth direction B may be any other opposite directions and will not be limited herein.

That is, on the first metal layer 102, a lower-height side the second vias 108 in one of the two rows may be opposite to a lower-height side of the second vias 108 in the other one of the two rows. In this way, the etching solution in the two rows of second vias 108 may flow out of the vias 108 easily.

Figure 3:
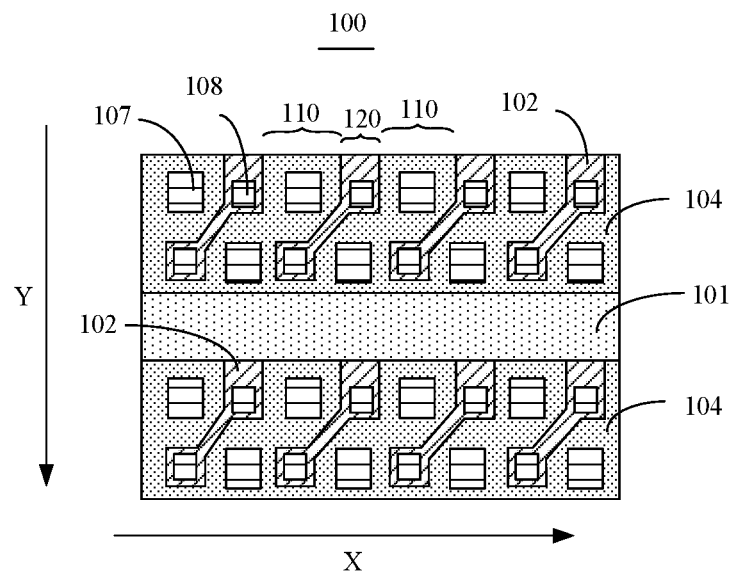
FIG. 3 is a top view of an array substrate according to a second embodiment of the present disclosure.

As shown in FIG. 3, FIG. 3 is a top view of an array substrate according to a second embodiment of the present disclosure.

In the present embodiment, on the array substrate 100, the first via 107, the second via 108, the first metal layer 102, the second metal layer 104, the base substrate 101 and connection relationships therebetween, and arrangement of the plurality of first vias 107 and the plurality of second vias 108 in the second direction Y and in the first direction X may be the same as those in the above embodiments, which may be referring to the above embodiments and will not be repeatedly described herein.

On each first metal layer 102, the second laminated portion 120, which is arranged with one row of second vias 108, extends towards the other one of the two rows of second vias to reach second vias, which are arranged in the other one of the two rows, adjacent and staggered to the instant second vias 108. To be noted that, staggered vias may refer to vias that are misaligned with each other in the direction X or in the direction Y as shown in FIG. 3, and adjacent second vias may refer to two vias of two closest vias of two adjacent rows. The second laminated portion 120 may further extend to reach the edge of the first metal layer 102 from the second vias, which are arranged in the other one of the two rows, adjacent and staggered to the instant second vias 108.

In an application, the plurality of first vias 107 on the first metal layer 102 are arranged in two rows, and the plurality of second vias 108 on the first metal layer 102 are arranged in two rows. The second laminated portion 120, which is arranged with the second vias 108 of a first of the two rows, extends to the second vias 108 of a second of the two rows and is connected to the second laminated portion 120, which is arranged with the second vias 108 of the second of the two rows. Further, the second laminated portion 120, which is arranged with the second vias 108 of a first of the two rows, extends from the second vias 108 of the second of the two rows to the edge of the first metal layer 102.

In an application, the plurality of first vias 107 on the first metal layer 102 are arranged in a plurality of rows, and the plurality of second vias 108 on the first metal layer 102 are arranged in a plurality of rows. The second laminated portion 120, which is arranged with the second vias 108 of a first of the plurality of rows, extends to the second vias 108 of a second of the plurality of rows and is connected to the second laminated portion 120, which is arranged with the second vias 108 of the second of the plurality of rows. Further, the second laminated portion 120, which is arranged with the second vias 108 of the first of the plurality of rows, extends from the second vias 108 of the second of the plurality of rows to the second vias of a third of the plurality of rows, . . . , and so on, until extending to reach the edge of the first metal layer 102.

Second laminated portions 120, each of which is arranged on a side of one row of second vias 108, may be connected with each other, such that the etching solution in the plurality of second vias 108 may flow out of the vias through a same path, increasing path utilization, reducing an etched area of the second metal layer 104, further reducing an etching cost.

Figure 4:
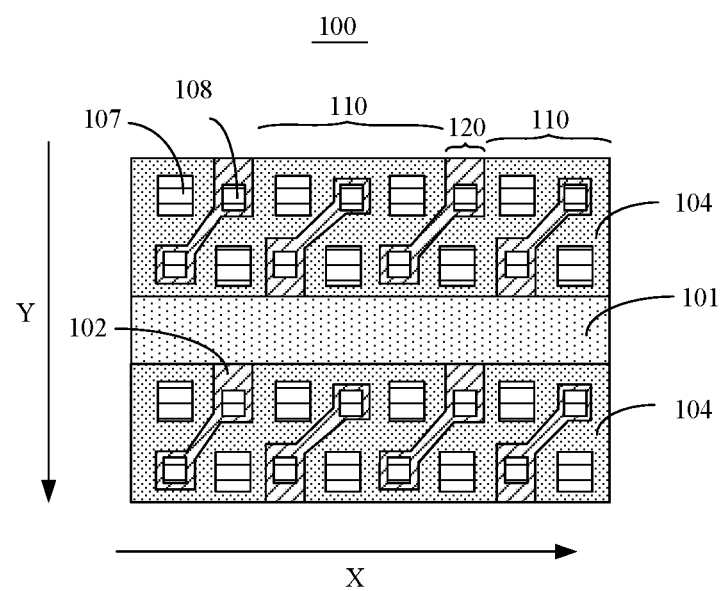
FIG. 4 is a top view of the array substrate according to a third embodiment of the present disclosure.

As shown in FIG. 4, FIG. 4 is a top view of the array substrate according to a third embodiment of the present disclosure.

In the present embodiment, on the array substrate 100, the first via 107, the second via 108, the first metal layer 102, the second metal layer 104, the base substrate 101 and connection relationships therebetween, and arrangement of the plurality of first vias 107 and the plurality of second vias 108 in the second direction Y and in the first direction X on the array substrate 100 may be the same as those in the above embodiments, which may be referred to the above description and will not be repeated herein.

On each first metal layer 120, the second laminated 120, which is arranged with a second via 108, extends to another second via 108 adjacent to and staggered with the instant second via 108, and is connected to the second laminated portion 120, which is arranged with the adjacent and staggered second via 108, and further extends from the adjacent and staggered second via 108 to the edge of the first metal layer 102. Adjacent second laminated portions 120 extend in opposite directions. Second laminated portions 120, which are arranged with adjacent second vias 108, may extend to reach opposite edges of the first metal layer 102.

Second laminated portions 120, which are arranged with adjacent and staggered second vias 108, may be connected to each other, such that the etching solution in various second vias 108 may flow out of the vias through a same path, increasing the path utilization, reducing an etched area on the second metal layer 104, and further reducing the etching cost. The second metal layer 104 may be arranged more freely.

Figure 5:
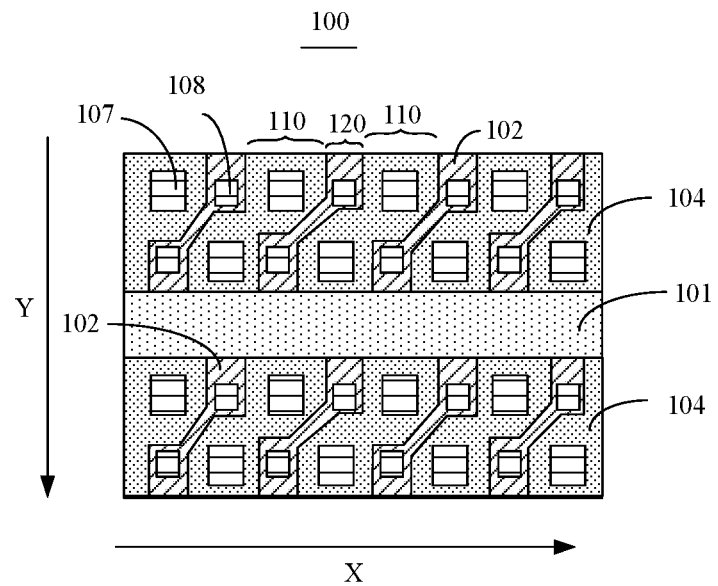
FIG. 5 is a top view of the array substrate according to a fourth embodiment of the present disclosure.

As shown in FIG. 5, FIG. 5 is a top view of the array substrate according to a fourth embodiment of the present disclosure.

In the present embodiment, on the array substrate 100, the first via 107, the second via 108, the first metal layer 102, the second metal layer 104, the base substrate 101 and connection relationships therebetween, and arrangement of the plurality of first vias 107 and the plurality of second vias 108 in the second direction Y and in the first direction X on the array substrate 100 may be the same as those in the above embodiments, which may be referred to the above description and will not be repeated herein.

In the present embodiment, the second laminated portion 120, which is arranged with one second via 108, extends to another second via 108 adjacent to and staggered with the instant second via 108, and further extends from the adjacent and staggered second via 108 to the edge of the first metal layer 102. That is, two conductive layers 106, which are arranged to cover the first metal layer 102 and configured to connect two second vias 108, extend towards corresponding edges of the first metal layer 102. Therefore, the etching solution in each second via 108 may flow out of the second via through two paths, further improving the efficiency and effectiveness that the etching solution flows out of the via.

The above four types of solution flowing paths of the present embodiment may be arranged on one first metal layer 102. Alternatively, each of the four types of solution flowing paths may be arranged on one first metal layer 102. Arrangement of the solution flowing paths may be determined based on actual needs, and will not be limited by the present disclosure.

Figure 6:
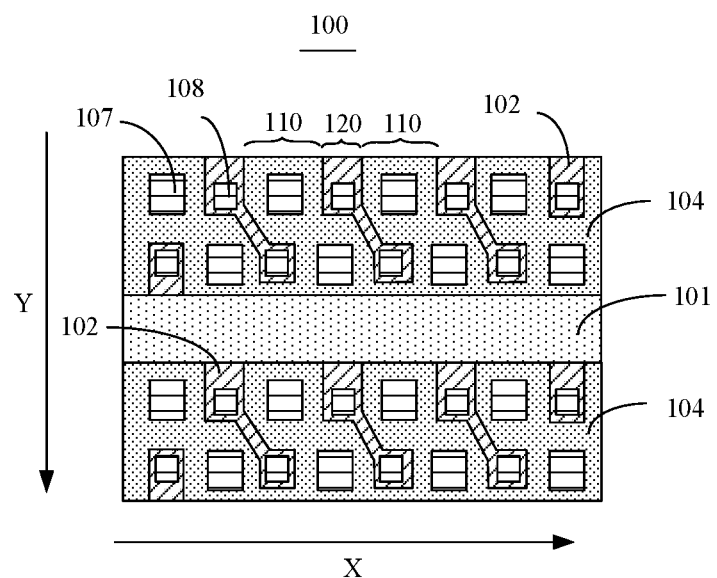
FIG. 6 is a top view of the array substrate according to a fifth embodiment of the present disclosure.

As shown in FIG. 6, FIG. 6 is a top view of the array substrate according to a fifth embodiment of the present disclosure.

In the present embodiment, on the array substrate 100, the first via 107, the second via 108, the first metal layer 102, the second metal layer 104, the base substrate 101 and connection relationships therebetween, and arrangement of the plurality of first vias 107 and the plurality of second vias 108 in the second direction Y and in the first direction X on the array substrate 100 may be the same as those in the above embodiments, which may be referred to the above description and will not be repeated herein.

The present embodiment may be a combination of the first implementation and the second implementation of the array substrate 100 of the embodiment shown in FIG. 1.

On the first metal layer 102, the second laminated portion 120, which is arranged with a portion of the second vias 108 of one row, and the second laminated portion 120, which is arranged with a portion of the second vias 108 of another row, extend in opposite directions to reach edges of the first metal layer 102. The second laminated portion 120, which is arranged with another portion of the second vias 108 of the one row, may be conductive to the second laminated portion 120, which is arranged with another portion of the second vias 108 of the another row staggered to the another portion of the second vias 108 of the one row. Further, the second laminated portion 120, which is arranged with the another portion of the second vias 108 of the one row, extends from the second vias 108 of the another row to the edge of the first metal layer 102.

In an application, on the first metal layer 102, a second laminated portion 120, which is arranged with second vias 108 of one row and near the edge, and a second laminated portion 120, which is arranged with a portion of second vias 108 of another row, extend in opposite directions to the edges of the first metal layer 102. On the first metal layer 102, a second laminated portion 120, which is arranged with second vias 108 located at a middle of the one row, is conductive to a second laminated portion 120, which is arranged with another portion of the second vias 108 of the another row staggered to the second vias 108 at the middle of the one row, and extends from the second vias 108 of the another row to the edge of the first metal layer 102.

Various second laminated portions 120 are arranged on a same first metal layer 102 and extend to various directions. In this way, the etching solution may flow out of the vias through a plurality of paths, improving the efficiency and effectiveness that the etching solution flows out of the vias.

Figure 7:
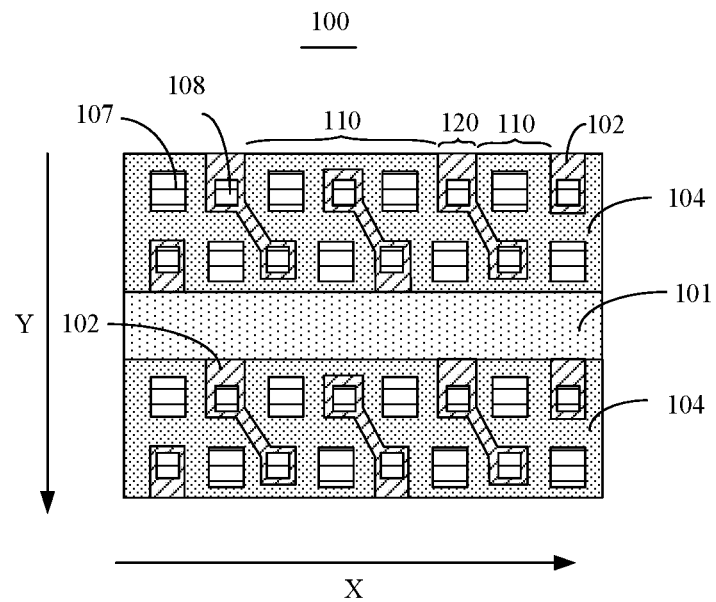
FIG. 7 is a top view of the array substrate according to a sixth embodiment of the present disclosure.

As shown in FIG. 7, FIG. 7 is a top view of the array substrate according to a sixth embodiment of the present disclosure.

In the present embodiment, on the array substrate 100, the first via 107, the second via 108, the first metal layer 102, the second metal layer 104, the base substrate 101 and connection relationships therebetween, and arrangement of the plurality of first vias 107 and the plurality of second vias 108 in the second direction Y and in the first direction X on the array substrate 100 may be the same as those in the above embodiments, which may be referred to the above description and will not be repeated herein.

The present embodiment may be a combination of the first implementation and the third implementation of the array substrate 100 of the embodiment shown in FIG. 1.

On the first metal layer 102, the second laminated portion 120, which is arranged with a portion of the second vias 108 of one row, and the second laminated portion 120, which is arranged with a portion of the second vias 108 of another row, extend in opposite directions to reach edges of the first metal layer 102. The second laminated portion 120, which is arranged with another portion of the second vias 108 of the one row, extend to reach second vias 108 adjacent to and staggered with the another portion of the second vias 108 of the one row and is conductive to the second laminated portion 120, which is arranged with another portion of the second vias 108 of the another row adjacent to and staggered with the another portion of the second vias 108 of the one row. Further, the second laminated portion 120, which is arranged with the another portion of the second vias 108 of the one row, extends from the adjacent and staggered second vias 108 to the edge of the first metal layer 102. Adjacent second laminated portions 120 extend in opposite directions.

In an application, on the first metal layer 102, a second laminated portion 120, which is arranged with second vias 108 of one row and near the edge, and a second laminated portion 120, which is arranged with a portion of second vias 108 of another row, extend in opposite directions to the edges of the first metal layer 102. On the first metal layer 102, a second laminated portion 120, which is arranged with second vias 108 located at a middle of the one row, is conductive to a second laminated portion 120, which is arranged with another portion of the second vias 108 of the another row and adjacent to and staggered with the second vias 108 at the middle of the one row, and extends from the second vias 108 of the another row to the edge of the first metal layer 102. Adjacent second laminated portions 120 extend in opposite directions.

When the vias of the first metal layer 102 are arranged in a plurality of rows, extending directions of the second laminated portions 120 may be similar to those described in the above embodiments and will not be repeated herein.

Figure 8:
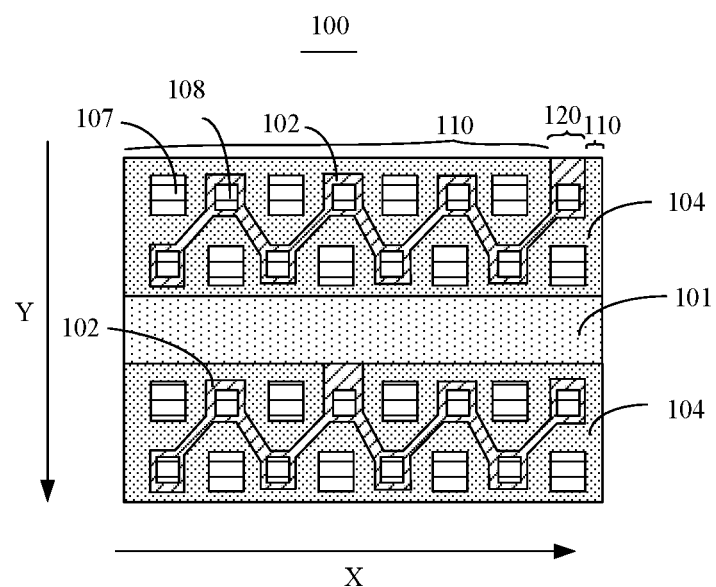
FIG. 8 is a top view of the array substrate according to a seventh embodiment of the present disclosure.

As shown in FIG. 8, FIG. 8 is a top view of the array substrate according to a seventh embodiment of the present disclosure.

In the present embodiment, on the array substrate 100, the first via 107, the second via 108, the first metal layer 102, the second metal layer 104, the base substrate 101 and connection relationships therebetween, and arrangement of the plurality of first vias 107 and the plurality of second vias 108 in the second direction Y and in the first direction X on the array substrate 100 may be the same as those in the above embodiments, which may be referred to the above description and will not be repeated herein.

In the present embodiment, second laminated portions 120, which are arranged with second vias 108 of a same first metal layer 102, are conductive with each other and extend through a same outlet to the edge of the first metal layer 102 to guide the etching solution to flow out of all second vias 108. The outlet may be defined in the second laminated portion 120, which is arranged with the second via 108 located at a side edge of the first metal layer 102. Alternatively, the outlet may be defined in the second laminated portion 120, which is arranged with the second via 108 located at the middle of the first metal layer 102. That is, an exact location of the edge of the first metal layer 102 that can be reached by the inter-conductive second laminated portions 120 will not be limited by the present disclosure.

In the present embodiment, the second laminated portions 120, which are arranged with second vias 108 of the same first metal layer 102, are conductive with each other, enabling the etching solution to flow out through one outlet, further reducing the etched area of the second metal layer 104. In this way, etching costs may be reduced, and the second metal layer 104 may be arranged more freely.

In some embodiments, the second laminated portions 120, which are arranged with second vias 108 of the same first metal layer 102, are conductive with each other and extend to reach the edges of the first metal layer 102, defining a plurality of outlets. In this way, the etching solution in all the second vias 108 may be guided to flow out of the vias through the plurality of outlets, increasing the efficiency that the etching solution flows out of the vias.

The second laminated portions 120 on the plurality of first metal layers 102 of a same array substrate 100 may be arranged according to a same embodiment or various embodiments. The arrangement of the second laminated portions 120 may be determined based on actual demands, and will not be limited herein.

According to the present disclosure, the array substrate is provided. The conductive layer on the side of the second via near the first via is arranged to cover the second insulating layer arranged on a side of the second metal layer. The conductive layer arranged on the side of the second via away from the first via is arranged to cover the second insulating layer arranged on a side of the first metal layer and extends to the edge of the first metal layer. In this way, the height difference is generated between two sides of the second via. While etching the array substrate, the etching solution at the second via may flow towards the side of the second via away from the first via due to the height difference to further flow out of the edge of the first metal layer. The amount of the etching solution remaining in the second via may be reduced, and less bubbles may be generated. Contact between the first metal layer and the second metal layer may not be affected, and the effective contact area between the conductive layer at the second via and the first metal layer may be increased, such that conductivity of the second via may be improved, electrical connection between the first metal layer and the second metal layer may be improved, and reliability and stability of the array substrate may be improved.

Figure 9:
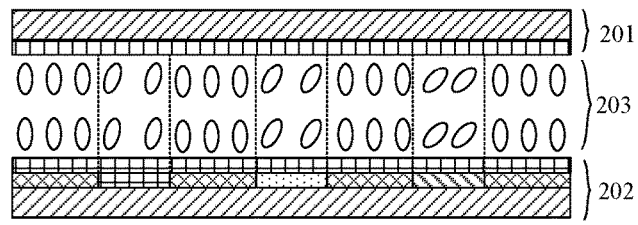
FIG. 9 is a structural schematic view of a display panel according to an embodiment of the present disclosure.

As shown in FIG. 9, FIG. 9 is a structural schematic view of a display panel according to an embodiment of the present disclosure.

In the present embodiment, the display panel 200 includes an array substrate 202, a color film substrate 201 and liquid crystal molecules 203. The array substrate 202 and the color film substrate 201 may be disposed opposite to each other. The liquid crystal molecules are disposed between the array substrate 202 and the color film substrate 201.

The array substrate 202 of the present embodiment may be the array substrate 100 of any of the above embodiments.

In the present embodiment, the array substrate which has improved electrical connection between the first metal layer and the second metal layer may be arranged to improve electrical connection of the display panel, such that the reliability and stability of the display panel.

Figure 10:
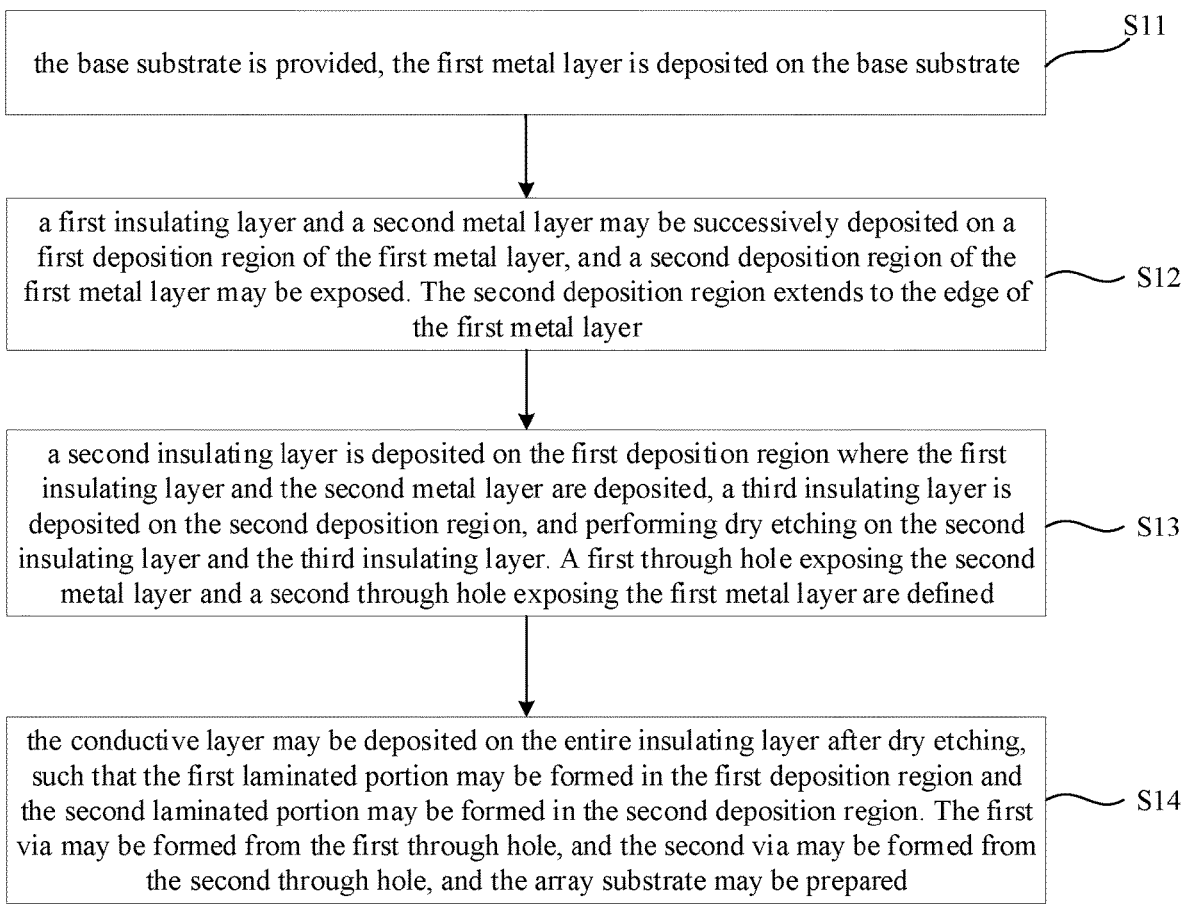
FIG. 10 is a flow chart of a method of manufacturing an array substrate according to an embodiment of the present disclosure.

As shown in FIG. 10, FIG. 10 is a flow chart of a method of manufacturing an array substrate according to an embodiment of the present disclosure.

In an operation S11, the base substrate is provided, the first metal layer is deposited on the base substrate.

The base substrate is provided first. The base substrate may include a glass substrate or a substrate in another type.

The first metal layer is deposited on the base substrate. The first metal layer may include a copper layer, a silver layer, a gold layer, or any other metal conductive layer.

In an application, after the first metal layer is deposited, the first metal layer may be photolithographed, and a gate metal pattern or a common electrode may be formed on the first metal layer.

In an application, after the first metal layer is deposited, depth controlling or dry etching may be performed on the first metal layer, such that the gate metal pattern or the common electrode may be formed on the first metal layer.

In an operation S12, a first insulating layer and a second metal layer may be successively deposited on a first deposition region of the first metal layer, and a second deposition region of the first metal layer may be exposed. The second deposition region extends to the edge of the first metal layer.

The first insulating layer and the second metal layer are deposited successively on the first deposition region of the first metal layer, and the second deposition region of the first metal layer may be exposed. The second deposition region extends to the edge of the first metal layer.

The first deposition region is a region of the first metal layer where the second metal layer is to be arranged. The second deposition area is a region of the first metal layer other than the first deposition region and extends to the edge of the first metal layer.

In an application, a gate insulating layer of silicon nitride, a semiconductor layer of hydrogenated amorphous silicon and an ohmic contact layer are successively deposited on the first metal layer to form the first insulating layer, and subsequently, the second metal layer is deposited. In some embodiments, other first insulating layers may be deposited based on actual needs. The second metal layer and the first insulating layer is etched and dry etched, and the first metal layer of the second deposited region is exposed. That is, a portion of the second metal layer and the first insulating layer laminated on the first metal layer may be removed to generate the height difference for the second via.

In an application, a dry film may be attached to the second deposition region of the first metal layer to prevent the first insulating layer and the second metal layer from being deposited on the second deposition region. After deposition, the dry film may be removed to expose the first metal layer of the second deposition region.

In an application, after deposition, the second metal layer may be etched and dry etched at first, such that a source electrode pattern and a drain electrode pattern may be formed on the second metal layer. Subsequently, the semiconductor layer of hydrogenated amorphous silicon and the ohmic contact layer may be etched and dry etched, such that a channel is defined. In another application, different etching and drying etching processes may be performed on the second metal layer and the first insulating layer based on different preparation demands, and a portion of the first metal layer is exposed to reach the edge of the first metal layer.

In the present operation, the first metal layer in the second deposition region may be exposed to generate the height difference on the substrate, such that, while performing the etching process, the etching solution may flow out of the substrate along the first metal layer exposed to the edge due to the height difference. Therefore, bubbles of the etching solution may not remain on the array substrate.

Figure 11:
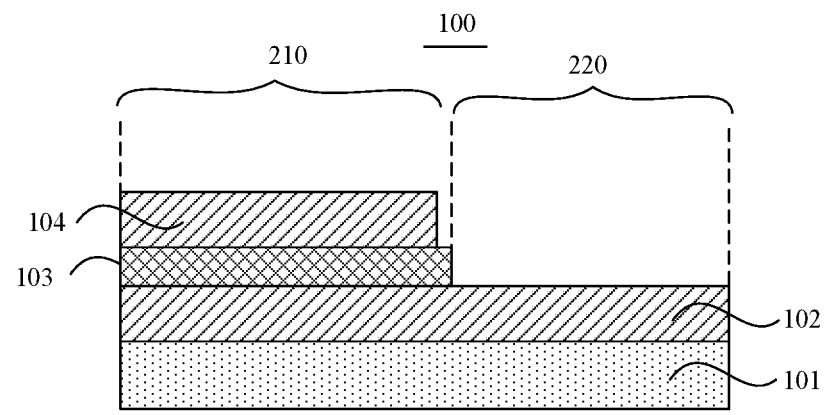
FIG. 11 is a structural schematic view of an array substrate after performing an operation S12 in the embodiment shown in FIG. 10.

As shown in FIG. 11, FIG. 11 is a structural schematic view of an array substrate after performing an operation S12 in the embodiment shown in FIG. 10.

In the present embodiment, the array substrate 100 may include a base substrate 101 and a first metal layer 102 laminated on and directly contacting the base substrate 101. The first metal layer 102 may include a first deposition region 210 and a second deposition region 220.

The first insulating layer 103 and the second metal layer 104 laminated on and directly contacting the first insulating layer 103 are arranged in the first deposition region 210 of the first metal layer 102. The first metal layer 102 of the second deposition region 220 may be exposed. The second deposition region 220 is connected to edges of the first metal layer 102. In this way, while performing the etching process, the etching solution may flow through the second deposition region 220 of the first metal layer 102 to the edges of the first metal layer 102 to further flow out of the entire array substrate 100, preventing the etching solution from remaining in the array substrate 100, preventing bubbles of the etching solution or the etching solution from affecting bonding forces between various layers and affecting contact areas between the various layers, and improving the stability and reliability of the array substrate 100.

In an operation S13, a second insulating layer is deposited on the first deposition region where the first insulating layer and the second metal layer are deposited, a third insulating layer is deposited on the second deposition region, and performing dry etching on the second insulating layer and the third insulating layer. A first through hole exposing the second metal layer and a second through hole exposing the first metal layer are defined.

The second insulating layer is deposited on the first deposition region where the first insulating layer and the second metal layer are deposited. The third insulating layer is deposited on the second deposition region. Dry etching is performed on the second insulating layer and the third insulating layer. The first through hole exposing the second metal layer and the second through hole exposing the first metal layer are defined. The second insulating layer and the third insulating layer are prepared by deposition at the same time, and may include a silicon nitride layer or other insulating protective layers.

In an application, a silicon nitride layer is deposited on the entire array substrate to allow the second insulating layer to be deposited on the first deposition region and to allow the third insulating layer to be deposited on the second deposition region.

Performing the dry etching on the second insulating layer based on a location where the first metal layer is arranged, and performing the dry etching on the third insulating layer based on a location where the second metal layer is arranged. In this way, the first through hole exposing the second metal layer and the second through hole exposing the first metal layer.

Figure 12:
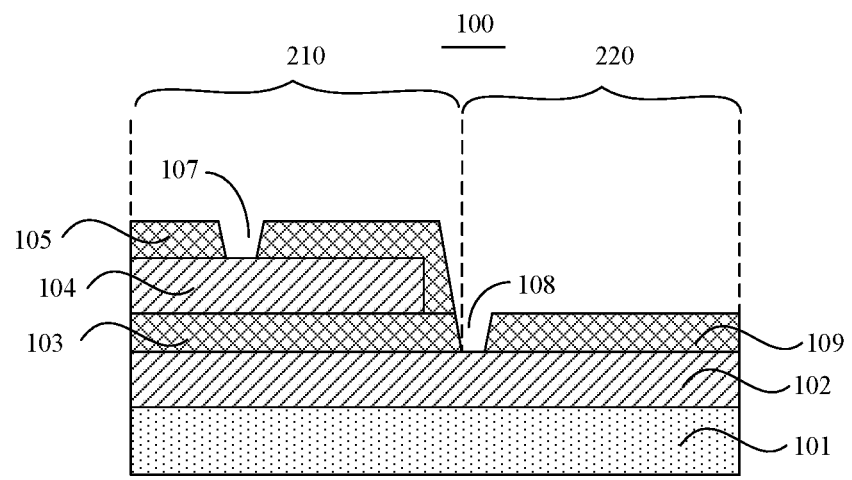
FIG. 12 is a structural schematic view of an array substrate after performing an operation S13 in the embodiment shown in FIG. 10.

As shown in FIG. 12, FIG. 12 is a structural schematic view of an array substrate after performing an operation S13 in the embodiment shown in FIG. 10.

In the present embodiment, the array substrate 100 may include a base substrate 101 and a first metal layer 102 laminated on and directly contacting the base substrate 101. The first metal layer 102 may include a first deposition region 210 and a second deposition region 220.

A first insulating layer 103, a second metal layer 104 and a second insulating layer 105 are laminated and are directly arranged on the first metal layer 102. Only a third insulating layer 109 is laminated on and directly contact the first metal layer 102 in the second deposition region 220.

The second insulating layer 105 in the first deposition region 210 defines the first through hole 307, and the third insulating layer 109 in the second deposition region 220 defines the second through hole 308.

In this case, each of the first through hole 307 and the second through hole 308 may be unfilled to expose the first metal layer 102 and the second metal layer 104, correspondingly, such that subsequent electrical connection may be prepared.

After the conductive layer is deposited subsequently, metallization may be achieved by the conductive layer, such that the first via and the second via may be obtained. That is, metal may be received in and filled in the through hole.

In an operation S14, the conductive layer may be deposited on the entire insulating layer after dry etching, such that the first laminated portion may be formed in the first deposition region and the second laminated portion may be formed in the second deposition region. The first via may be formed from the first through hole, and the second via may be formed from the second through hole, and the array substrate may be prepared.

The conductive layer is deposited on the second insulating layer having the first through hole and on the third insulating layer having the second through hole, such that the first laminated portion is formed in the first deposition region and includes the first insulating layer, the second metal layer, the second insulating layer and the first conductive layer that are laminated and directly arranged on the first metal layer, and the second laminated portion is formed in the second deposition region and includes the third insulating layer and the second conductive layer that are laminated and directly arranged on the first metal layer. The surface of the second metal layer and inner walls of the first through hole and the second through hole may be metallized, such that the first via may be formed from the first through hole, and the second via may be formed from the second through hole. The conductive layer may include tin oxide or other conductive metals.

The first via and the second via are connected with each other through the conductive layer covering the second metal layer, such that the second metal layer connected with the first via is electrically connected to the first metal layer connected with the second via through the first via, the first conductive layer, the second conductive layer and the second via.

Since the height difference, which allows the etching solution to flow smoothly to the edge of the substrate, is generated in the operation S12, a second laminated layer formed after arranging the insulating layer and the conductive layer also has the height difference.

Further, since the etching solution flows out of the substrate smoothly, air bubbles remining on the array substrate may be reduced. Therefore, when arranging the conductive layer, the effective contact area between the conductive layer and the metal layer is increased, connection between the conductive layer and various metal layers is improved, and the reliability and stability of the array substrate is improved.

According to the method of manufacturing the array substrate of the present embodiment, when the second metal layer and the first insulating layer are deposited, a portion of the first metal layer is exposed to reach the edge of the first metal layer, such that the height difference and the flowing patch, which allow the etching solution to flow out of the substrate, are defined in the substrate. In this way, the etching solution may flow out of the substrate smoothly, and air bubbles remaining on the substrate may be reduced. When the conductive layer is arranged, the effective contact area between the conductive layer and the metal layer is increased, the connection between the conductive layer and various metal layers is improved, and the reliability and stability of the array substrate is improved.

The above description shows only embodiments of the present disclosure and does not limit the scope of the present disclosure. Any equivalent structure or equivalent process transformation performed based on the specification and accompanying drawings, applied directly or indirectly in other related fields, shall be equally covered by the scope of the present disclosure.

What is claimed is:

1. An array substrate, comprising: a base substrate and a plurality of first metal layers laminated on and directly contacting the base substrate, wherein,
    the plurality of first metal layers are spaced apart from each other;
    each of the plurality of first metal layers is provided with a respective first laminated portion and a respective second laminated portion;
    the respective first laminated portion and the respective second laminated portion are arranged on and directly contact a side of each of the plurality of first metal layers away from the base substrate;
    the respective first laminated portion comprises a first insulating layer, a second metal layer, a second insulating layer and a first conductive layer, wherein the first insulating layer, the second metal layer, the second insulating layer and the first conductive layer are successively laminated;
    the respective first laminated portion is arranged with a plurality of first vias;
    the respective second laminated portion comprises a third insulating layer and a second conductive layer laminated on and directly contacting the third insulating layer;
    the respective second laminated portion is arranged with a plurality of second vias;
    for each of the plurality of first metal layers, each of the plurality of first vias is connected to the first conductive layer and a corresponding one of the plurality of second vias, and each of the plurality of second vias is connected to the second conductive layer and a corresponding one of the plurality of first vias,
    the plurality of first vias and the plurality of second vias are spaced apart from each other and are arranged alternately in a first direction;
    the respective second laminated portion is extended to reach an edge of each of the plurality of first metal layers; and
    a height of the respective first laminated portion is greater than a height of the respective second laminated portion, and a height different is generated between two sides of each of the plurality of second vias; and the first conductive layer is connected to the second conductive layer to allow each of the plurality of first metal layers to be conductive with the second metal layer.

2. The array substrate according to claim 1, wherein,
    the first via extends through the second insulating layer of the first laminated portion to reach the second metal layer; and
    the second via extends through the third insulating layer of the second laminated portion to reach the first metal layer.

3. The array substrate according to claim 1, wherein,
the plurality of first vias of each of the plurality of first metal layers are arranged in at least two rows, and the plurality of second vias of each of the plurality of first metal layers are arranged in at least two rows; and
the plurality of first vias and the plurality of second vias are arranged alternately in a second direction, and the second direction is perpendicular to the first direction.

4. The array substrate according to claim 3, wherein,
the plurality of first vias of each of the plurality of first metal layers are arranged in two rows, and the plurality of second vias of each of the plurality of first metal layers are arranged in two rows;
on each of the plurality of first metal layers, a second laminated portion, which is arranged with one of the two rows of second vias, extends in a third direction to reach the edge of the first metal layer;
on each of the plurality of first metal layers, another second laminated portion, which is arranged with the other one of the two rows of second vias, extends in a fourth direction to reach the edge of the first metal layer;
the third direction is opposite to the fourth direction.

5. The array substrate according to claim 3, wherein,
on each of the plurality of first metal layers, a second laminated portion, which is arranged with one of the two rows of second vias, extends to reach second vias, which are located on the other one of the two rows and are adjacent to and staggered with the second vias of the one of the two rows, and extends from the adjacent and staggered second vias of the other one of the two rows to the edge of the first metal layer.

6. The array substrate according to claim 3, wherein,
on each of the plurality of first metal layers, a second laminated portion, which is arranged with one of the plurality of second vias, extends to reach another one of the plurality of second vias adjacent to and staggered with the one of the plurality of second vias, and extends from the adjacent and staggered second via to the edge of the first metal layer; and
adjacent second laminated portions extend towards opposite directions.

7. A display panel, comprising an array substrate, a color film substrate, and liquid crystal molecules, wherein the array substrate and the color film substrate are disposed opposite to each other, the liquid crystal molecules are disposed between the array substrate and the color film substrate,
wherein the array substrate comprises: a base substrate and a plurality of first metal layers laminated on and directly contacting the base substrate;
the plurality of first metal layers are spaced apart from each other;
each of the plurality of first metal layers is provided with a respective first laminated portion and a respective second laminated portion;
the respective first laminated portion and the respective second laminated portion are arranged on and directly contact a side of each of the plurality of first metal layers away from the base substrate;
the respective first laminated portion comprises a first insulating layer, a second metal layer, a second insulating layer and a first conductive layer, wherein the first insulating layer, the second metal layer, the second insulating layer and the first conductive layer are successively laminated;
the respective first laminated portion is arranged with a plurality of first vias;
the respective second laminated portion comprises a third insulating layer and a second conductive layer laminated on and directly contacting the third insulating layer;
the respective second laminated portion is arranged with a plurality of second vias;
for each of the plurality of first metal layers, each of the plurality of first vias is connected to the first conductive layer and a corresponding one of the plurality of second vias, and each of the plurality of second vias is connected to the second conductive layer and a corresponding one of the plurality of first vias;
the plurality of first vias and the plurality of second vias are spaced apart from each other and are arranged alternately in a first direction;
the respective second laminated portion is extended to reach an edge of each of the plurality of first metal layers; and
a height of the respective first laminated portion is greater than a height of the respective second laminated portion, and a height different is generated between two sides of each of the plurality of second vias; and the first conductive layer is connected to the second conductive layer to allow each of the plurality of first metal layers to be conductive with the second metal layer.

8. The display panel according to claim 7, wherein,
the first via extends through the second insulating layer of the first laminated portion to reach the second metal layer; and
the second via extends through the third insulating layer of the second laminated portion to reach the first metal layer.

9. The display panel according to claim 7, wherein,
the plurality of first vias of each of the plurality of first metal layers are arranged in at least two rows, and the plurality of second vias of each of the plurality of first metal layers are arranged in at least two rows; and
the plurality of first vias and the plurality of second vias are arranged alternately in a second direction, and the second direction is perpendicular to the first direction.

10. The display panel according to claim 9, wherein,
the plurality of first vias of each of the plurality of first metal layers are arranged in two rows, and the plurality of second vias of each of the plurality of first metal layers are arranged in two rows;
on each of the plurality of first metal layers, a second laminated portion, which is arranged with one of the two rows of second vias, extends in a third direction to reach the edge of the first metal layer;
on each of the plurality of first metal layers, another second laminated portion, which is arranged with the other one of the two rows of second vias, extends in a fourth direction to reach the edge of the first metal layer;
the third direction is opposite to the fourth direction.

11. The display panel according to claim 9, wherein,
on each of the plurality of first metal layers, a second laminated portion, which is arranged with one of the two rows of second vias, extends to reach second vias, which are located on the other one of the two rows and are adjacent to and staggered with the second vias of the one of the two rows, and extends from the adjacent and staggered second vias of the other one of the two rows to the edge of the first metal layer.

12. The display panel according to claim 9, wherein,
on each of the plurality of first metal layers, a second laminated portion, which is arranged with one of the plurality of second vias, extends to reach another one of the plurality of second vias adjacent to and staggered with the one of the plurality of second vias, and extends from the adjacent and staggered second via to the edge of the first metal layer; and
adjacent second laminated portions extend towards opposite directions.

* * * * *